(12) United States Patent
Kim et al.

(10) Patent No.: US 11,562,858 B2
(45) Date of Patent: Jan. 24, 2023

(54) MULTILAYER CERAMIC CAPACITOR AND BOARD HAVING THE SAME MOUNTED THEREON

(71) Applicant: SAMSUNG ELECTRO-MECHANICS CO., LTD., Suwon-si (KR)

(72) Inventors: Ho Yoon Kim, Suwon-si (KR); Man Su Byun, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/337,939

(22) Filed: Jun. 3, 2021

(65) Prior Publication Data

US 2022/0189695 A1    Jun. 16, 2022

(30) Foreign Application Priority Data

Dec. 14, 2020   (KR) ........................ 10-2020-0174230

(51) Int. Cl.
*H01G 4/232*   (2006.01)
*H01G 4/30*   (2006.01)
(Continued)

(52) U.S. Cl.
CPC ........... *H01G 4/2325* (2013.01); *H01G 4/248* (2013.01); *H01G 4/30* (2013.01); *H05K 1/111* (2013.01);
(Continued)

(58) Field of Classification Search
None
See application file for complete search history.

(56) References Cited

U.S. PATENT DOCUMENTS 9,064,636 B1 *   6/2015  Sugita ..................... H01G 4/12
9,093,220 B1 *   7/2015  Kitano ................. H01G 4/1218
(Continued)

FOREIGN PATENT DOCUMENTS

CN   104465078 A *   3/2015   ............. H01C 1/148
CN   104465090 A *   3/2015   ............. H01C 7/008
(Continued)

*Primary Examiner* — Timothy J. Dole
*Assistant Examiner* — Muhammed Azam
(74) *Attorney, Agent, or Firm* — Morgan, Lewis & Bockius LLP

(57) ABSTRACT

A multilayer capacitor includes a capacitor body including a dielectric layer and first and second internal electrodes; first and second external electrodes; and an insulator disposed on a first surface of the capacitor body. The capacitor body includes an active region in which first and second internal electrodes overlap each other in a first direction, and upper and lower covers disposed above and below the active region in the first direction. A length of the active region in the second direction is defined as 'La', a length of one margin of the capacitor body in the second direction is defined as 'Lm', a height of the active region in the first direction is defined as 'Ta', a thickness of the lower cover of the capacitor body is defined as 'Tc', and a thickness of the insulator is defined as 'Te'. A relative displacement index, $((La/Lm)-(Ta/Tc))/Te)^2$, ranges from 0.003 to 0.055.

19 Claims, 4 Drawing Sheets

(51) Int. Cl.
*H05K 1/18* (2006.01)
*H05K 1/11* (2006.01)
*H01G 4/248* (2006.01)

(52) U.S. Cl.
CPC ... *H05K 1/181* (2013.01); *H05K 2201/10015* (2013.01)

(56) References Cited

U.S. PATENT DOCUMENTS

| | | | | |
|---|---|---|---|---|
| 9,099,246 | B1* | 8/2015 | Kitano | H01G 4/012 |
| 9,099,247 | B1* | 8/2015 | Kitano | H01G 4/1227 |
| 9,155,197 | B2* | 10/2015 | Lee | H01G 4/12 |
| 9,288,906 | B2* | 3/2016 | Lee | H01G 4/12 |
| 9,449,760 | B2* | 9/2016 | Kitano | H01G 4/1209 |
| 9,530,561 | B2* | 12/2016 | Fujita | H01G 4/248 |
| 9,620,287 | B2* | 4/2017 | Kitano | H01G 4/248 |
| 9,627,137 | B2* | 4/2017 | Kitano | H01G 4/1218 |
| 9,640,323 | B2* | 5/2017 | Sugita | H01G 4/38 |
| 9,659,712 | B2* | 5/2017 | Sugita | H01G 4/30 |
| 9,728,335 | B2* | 8/2017 | Kitano | H01G 4/232 |
| 9,728,336 | B2* | 8/2017 | Kitano | H01G 4/38 |
| 9,947,466 | B2* | 4/2018 | Hattori | H01G 2/065 |
| 9,974,183 | B2* | 5/2018 | Chae | H05K 1/111 |
| 9,984,826 | B2* | 5/2018 | Morito | H01G 4/232 |
| 10,332,685 | B2* | 6/2019 | Kim | H01G 4/30 |
| RE47,624 | E* | 10/2019 | Tang | H01G 4/12 |
| 10,843,972 | B2* | 11/2020 | Kaneda | G01R 31/64 |
| 11,240,064 | B2* | 2/2022 | Rubenstein | H04L 61/4511 |
| 11,271,778 | B2* | 3/2022 | Rubenstein | H04L 47/805 |
| 11,322,304 | B2* | 5/2022 | Kwon | H01G 4/2325 |
| 2004/0233612 | A1* | 11/2004 | Sugimoto | H01G 4/30 361/312 |
| 2004/0240146 | A1* | 12/2004 | Kayatani | H01G 2/103 361/306.3 |
| 2006/0018104 | A1* | 1/2006 | Katayama | H05K 1/0239 361/783 |
| 2008/0013252 | A1* | 1/2008 | Nakano | H01G 4/30 361/311 |
| 2011/0303458 | A1* | 12/2011 | Sutay | H01G 4/35 427/125 |
| 2012/0300361 | A1* | 11/2012 | Togashi | H01G 4/12 156/89.12 |
| 2013/0050894 | A1* | 2/2013 | Ahn | H01G 4/12 361/306.3 |
| 2013/0222972 | A1* | 8/2013 | Saito | H01G 4/005 361/301.4 |
| 2013/0229748 | A1* | 9/2013 | Chung | H01G 4/30 336/200 |
| 2013/0233606 | A1* | 9/2013 | Fujii | H05K 1/16 174/260 |
| 2013/0284506 | A1* | 10/2013 | Zan | H05K 1/185 29/832 |
| 2013/0319741 | A1* | 12/2013 | Ahn | H05K 1/0271 361/728 |
| 2013/0321981 | A1* | 12/2013 | Ahn | H01G 2/065 361/728 |
| 2014/0020942 | A1* | 1/2014 | Cho | H05K 1/181 361/301.4 |
| 2014/0083755 | A1* | 3/2014 | Lee | H01G 2/24 338/21 |
| 2014/0116766 | A1* | 5/2014 | Jeon | H05K 3/3442 361/321.2 |
| 2014/0131082 | A1* | 5/2014 | Ahn | H01G 4/30 361/301.4 |
| 2014/0133064 | A1* | 5/2014 | Ahn | H01G 4/012 361/303 |
| 2014/0138136 | A1* | 5/2014 | Ahn | H05K 3/3442 361/301.4 |
| 2014/0144687 | A1* | 5/2014 | Ahn | H01G 2/06 361/301.4 |
| 2014/0151102 | A1* | 6/2014 | Lee | H01G 4/002 361/301.4 |
| 2014/0153156 | A1* | 6/2014 | Park | H01G 4/30 361/303 |
| 2014/0168849 | A1* | 6/2014 | Lee | H01G 4/12 361/301.4 |
| 2014/0168852 | A1* | 6/2014 | Park | H01G 4/012 361/303 |
| 2014/0174806 | A1* | 6/2014 | Park | H01G 2/06 361/321.2 |
| 2014/0185184 | A1* | 7/2014 | Ahn | H01G 4/232 361/301.4 |
| 2014/0209362 | A1* | 7/2014 | Park | H01G 4/012 361/301.4 |
| 2014/0290998 | A1* | 10/2014 | Ahn | H01G 4/248 361/301.4 |
| 2014/0318845 | A1* | 10/2014 | Kim | H01G 4/005 361/301.4 |
| 2015/0021073 | A1* | 1/2015 | Kim | H01G 4/12 174/258 |
| 2015/0043125 | A1* | 2/2015 | Park | H01G 4/30 156/89.12 |
| 2015/0047887 | A1* | 2/2015 | Lee | H05K 1/111 174/260 |
| 2015/0062775 | A1* | 3/2015 | Shibasaki | H01G 4/012 361/301.4 |
| 2015/0083477 | A1* | 3/2015 | Lee | H01G 4/232 361/301.4 |
| 2015/0122534 | A1* | 5/2015 | Park | H01G 2/065 174/260 |
| 2016/0049255 | A1* | 2/2016 | Sugita | H01G 4/232 361/301.4 |
| 2016/0049256 | A1* | 2/2016 | Kitano | H01G 4/1209 361/301.4 |
| 2016/0099105 | A1* | 4/2016 | Lee | H01G 2/065 361/301.4 |
| 2018/0126175 | A1* | 5/2018 | Seitz | H01G 4/224 |
| 2019/0103223 | A1* | 4/2019 | Park | H05K 3/3442 |
| 2019/0321628 | A1* | 10/2019 | Stevenson | H01G 4/228 |
| 2020/0273621 | A1 | 8/2020 | Yi et al. | |
| 2021/0205616 | A1* | 7/2021 | Frysz | H01G 4/35 |
| 2022/0181084 | A1* | 6/2022 | Byun | H01G 4/224 |
| 2022/0189695 | A1* | 6/2022 | Kim | H01G 4/248 |

FOREIGN PATENT DOCUMENTS

| | | | | |
|---|---|---|---|---|
| JP | 2014027085 | A * | 2/2014 | H01G 4/232 |
| JP | 6501402 | B2 * | 4/2019 | H01G 2/06 |
| KR | 10-1422928 | B1 | 7/2014 | |
| KR | 10-2020-0102319 | A | 8/2020 | |

* cited by examiner

MULTILAYER CERAMIC CAPACITOR AND BOARD HAVING THE SAME MOUNTED THEREON

CROSS-REFERENCE TO RELATED APPLICATION(S)

The present application claims the benefit of priority to Korean Patent Application No. 10-2020-0174230, filed on Dec. 14, 2020 in the Korean Intellectual Property Office, the disclosure of which is incorporated herein by reference in its entirety.

TECHNICAL FIELD

The present disclosure relates to a multilayer ceramic capacitor and a board having the same mounted thereon.

BACKGROUND

A multilayer capacitor may have a structure in which a plurality of dielectric layers and internal electrodes having different polarities are alternately disposed between the dielectric layers.

Such a multilayer capacitor has been widely used as a component of various electronic devices as a multilayer capacitor, may be miniaturized, may secure high capacity, and may be easily mounted.

Since the dielectric layer has piezoelectricity using a ferroelectric material, a piezoelectric phenomenon occurs between internal electrodes when a direct or alternating voltage is applied to the multilayer capacitor, such that a volume of a capacitor body may expand or reduce according to a frequency, and periodic vibrations may be generated.

Such vibrations may be transmitted to a board through an external electrode of the multilayer capacitor and a solder connecting the external electrode to the board, such that the entire board becomes an acoustic reflective surface, and vibration sound, noise, may be generated.

Such vibration sound may correspond to an audible frequency in the range of 20 to 20,000 Hz causing discomfort to listeners, and such vibration sound causing discomfort to listeners is known as acoustic noise.

SUMMARY

An aspect of the present disclosure is to provide a multilayer which may reduce acoustic noise and may improve warpage strength, and a board having the same mounted thereon.

According to an aspect of the present disclosure, a multilayer capacitor includes a capacitor body including a dielectric layer and first and second internal electrodes alternately disposed with the dielectric layer interposed therebetween, and including first and second surfaces opposing each other in a first direction, third and fourth surfaces opposing each other in a second direction perpendicular to the first direction, and fifth and sixth surfaces opposing each other in a third direction perpendicular to the first and second directions; first and second external electrodes disposed to cover the third and fourth surfaces, respectively, and connected to the first and second internal electrodes, respectively; and an insulator disposed on the first surface of the capacitor body. The capacitor body includes an active region in which first and second internal electrodes overlap each other in the first direction, and upper and lower covers disposed above and below the active region in the first direction. Where a length of the active region in the second direction is defined as 'La', a length of one margin of the capacitor body in the second direction is defined as 'Lm', a height of the active region in the first direction is defined as 'Ta', a thickness of the lower cover of the capacitor body is defined as 'Tc', and a thickness of the insulator is defined as 'Te', a relative displacement index, $((La/Lm)-(Ta/Tc))/Te)^2$, ranges from 0.003 to 0.055.

The multilayer capacitor may further include a first conductive resin layer covering the first external electrode and a first end of the insulator; and a second conductive resin layer covering the second external electrode and a second end of the insulator.

the first external electrode includes a first connection portion disposed on the third surface of the capacitor body; and a first band portion extending from the first connection portion onto a portion of the first surface of the capacitor body, and the second external electrode includes a second connection portion disposed on the fourth surface of the capacitor body; and a second band portion extending from the second connection portion to a portion of the first surface of the capacitor body.

The insulator is disposed to cover the first and second band portions.

A thickness of the insulator may be 16 μm or greater.

The first and second external electrodes may include copper (Cu).

The first and second conductive resin layers may include a conductive metal and a resin.

The first and second external electrodes may include copper (Cu), and the first and second conductive resin layers may include a conductive metal and a resin.

The insulator may include a material different from a material of the capacitor body.

The insulator may include a material more flexible than a dielectric material included in the capacitor body.

The insulator may include epoxy.

The multilayer capacitor may further include first and second plating layers covering the first and second conductive resin layers, respectively.

The first and second plating layers may include first and second nickel (Ni) plating layers covering the first and second conductive resin layers, respectively, and first and second tin (Sn) plating layers covering the first and second nickel (Ni) plating layers, respectively.

The multilayer capacitor may have a length of 1.0 mm or less in a direction perpendicular to the third and fourth surfaces of the capacitor body, and a length of 0.5 mm or less in a direction perpendicular to the fifth and sixth surfaces of the capacitor body.

According to an aspect of the present disclosure, a board including a multilayer capacitor mounted thereon includes a board having first and second electrode pads on one surface of the board; and a multilayer capacitor, wherein the multilayer capacitor is mounted such that first and second plating layers of the multilayer capacitor are connected to first and second electrode pads, respectively.

According to another aspect of the present disclosure, a multilayer capacitor includes a capacitor body including a dielectric layer and first and second internal electrodes alternately disposed with the dielectric layer interposed therebetween, and including first and second surfaces opposing each other in a first direction, third and fourth surfaces opposing each other in a second direction perpendicular to the first direction, and fifth and sixth surfaces opposing each other in a third direction perpendicular to the first and second directions; first and second external electrodes disposed to cover the third and fourth surfaces, respectively, and connected to the first and second internal electrodes, respectively; first and second conductive resin layers covering the first and second external electrodes, respectively; and an insulator disposed on the first surface of the capacitor body. Each of the first and second external electrodes includes a connection portion disposed on the third or fourth surface of the capacitor body; and a band portion extending from the connection portion onto a portion of the first surface of the capacitor body. A portion of the insulator is disposed between the band portion and the first or second conductive resin layer in the first direction.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
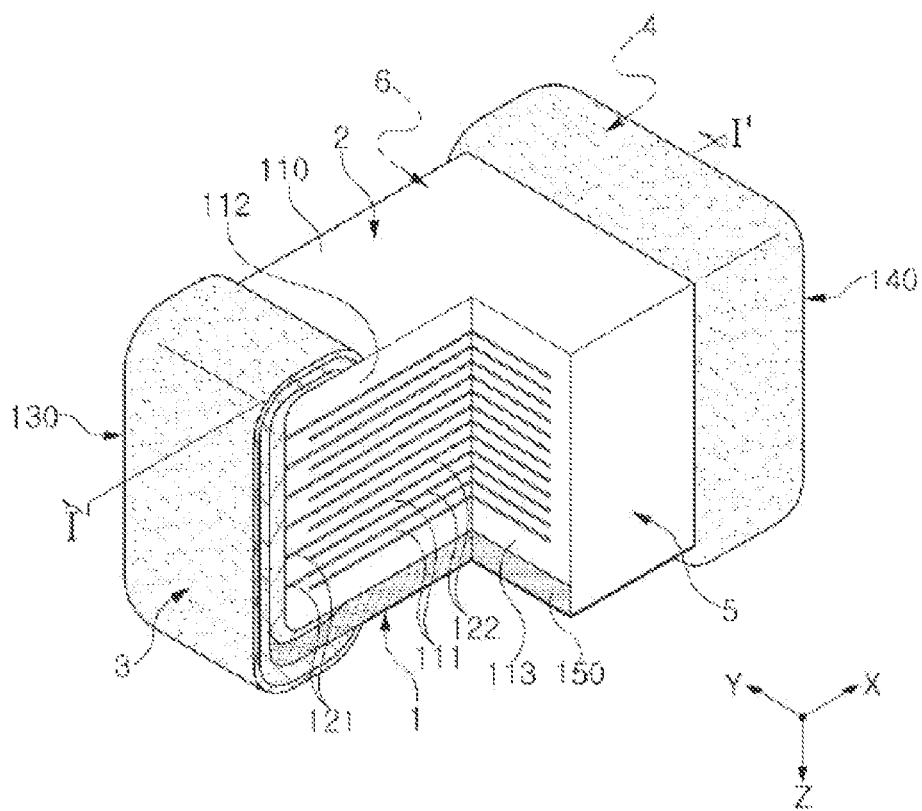
FIG. 1 is a perspective diagram illustrating a portion of a multilayer capacitor according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

Accordingly, shapes and sizes of elements in the drawings may be exaggerated for clarity of description, and elements indicated by the same reference numeral are the same elements in the drawings.

Further, throughout the specification, it will be understood that when a portion "includes" an element, it may further include another element, not excluding another element, unless otherwise indicated.

As for the directions of the capacitor body 110, in the drawings, X, Y, and Z indicated in the drawings represent a length direction, a width direction, and a thickness direction of the capacitor body, respectively. The Z direction may be the same as a laminating direction in which the dielectric layers 111 are laminated.

Figure 2A:
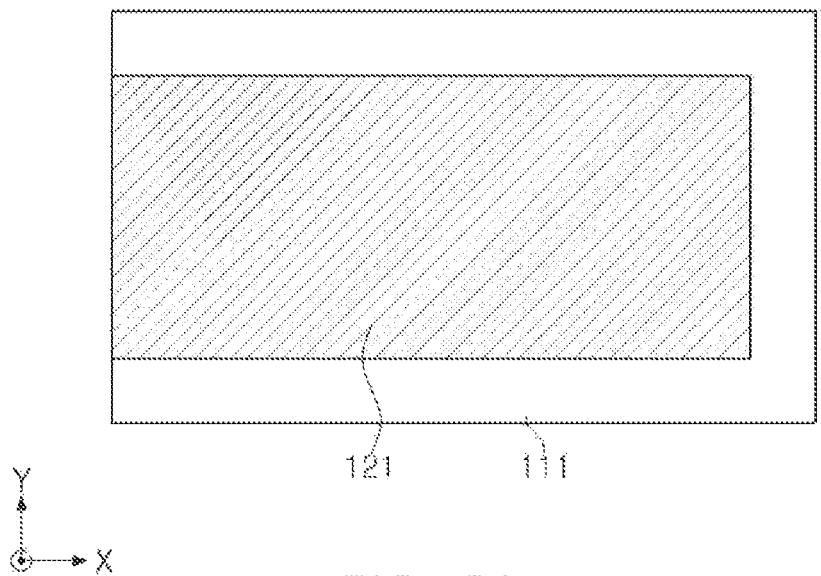
FIGS. 2A and 2B are plan diagrams illustrating first and second internal electrodes illustrated in FIG. 1.
Figure 2B:
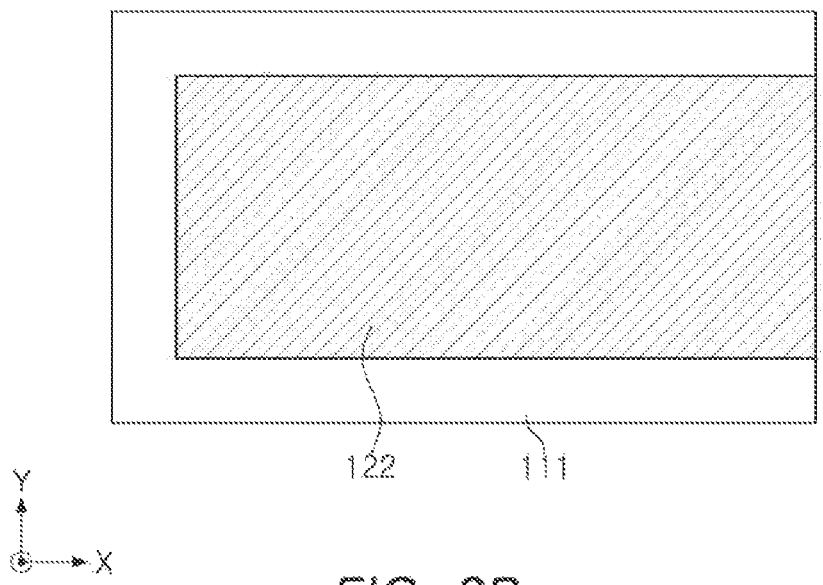
Figure 3:
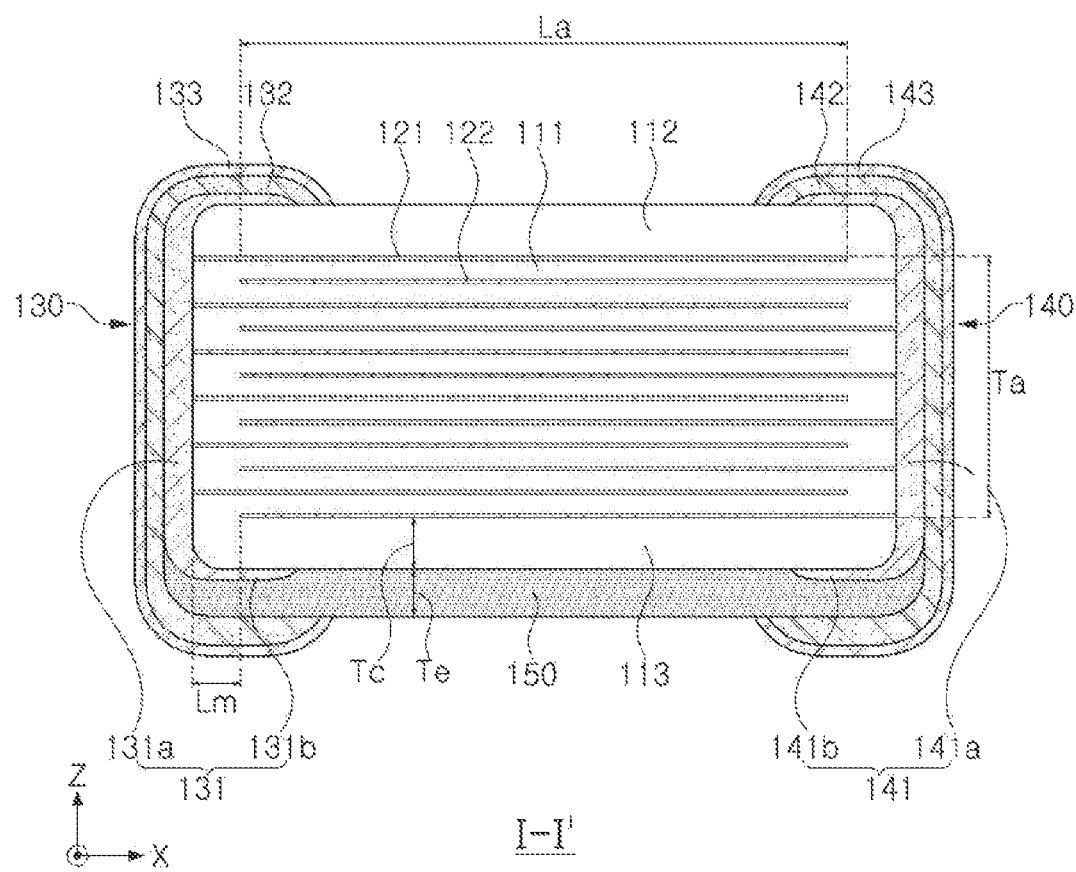
FIG. 3 is a cross-sectional diagram taken along line I-I' in FIG. 1.

FIG. 1 is a perspective diagram illustrating a portion of a multilayer capacitor according to an example embodiment. FIGS. 2A and 2B are plan diagrams illustrating first and second internal electrodes illustrated in FIG. 1. FIG. 3 is a cross-sectional diagram taken along line I-I' in FIG. 1.

Referring to FIGS. 1 to 3, a multilayer capacitor 100 in the example embodiment may include a capacitor body 110, first and second external electrodes 131 and 132, and an insulator 150.

The capacitor body 110 may be obtained by laminating a plurality of dielectric layers 111 in the Z direction and sintering the dielectric layers, and boundaries between the dielectric layers 111 of the capacitor body 110 adjacent to each other may be integrated such that it may be difficult to identify the boundaries without using a scanning electron microscope (SEM).

In this case, the capacitor body 110 may have a substantially hexahedral shape, but an example embodiment thereof is not limited thereto. The shape and the dimensions of the capacitor body 110 and the number of the laminated dielectric layers 111 are not limited to the example illustrated in the drawings.

In the example embodiment, both surfaces of the capacitor body 110 opposing each other in the Z direction may be defined as first and second surfaces 1 and 2, both surfaces connected to the first and second surfaces 1 and 2 and opposing each other in the X direction may be defined as third and fourth surfaces 3 and 4, and both surfaces connected to the first and second surfaces 1 and 2 and the third and fourth surfaces 3 and 4 and opposing each other in the Y direction may be defined as fifth and sixth surfaces 5 and 6.

In the example embodiment, the mounting surface of the multilayer capacitor 100 may be the first surface 1, the lower surface of the capacitor body 110 in the drawing.

The dielectric layer layers 111 may include a high-k ceramic material, barium titanate (BaTiO3) or strontium titanate (SrTiO3) ceramic powder, for example, but an example embodiment thereof is not limited thereto as long as sufficient capacitance is able to be obtained.

The dielectric layers 111 may further include ceramic additives, organic solvents, plasticizers, binders, and dispersants in addition to ceramic powder.

As the ceramic additives, a transition metal oxide or a transition metal carbide, a rare earth element, magnesium (Mg) or aluminum (Al) may be used.

The capacitor body 110 may include an active region in which the first and second internal electrodes 121 and 122 overlap each other, the region contributing to the formation of capacitance of the capacitor, and upper and lower covers 112 and 113 formed above and below the active region in the Z direction as upper and lower margin portions.

The upper and lower covers 112 and 113 may have a material and a configuration the same as those of the dielectric layers 111 other than the configuration in which the upper and lower covers do not include internal electrodes.

The upper and lower covers 112 and 113 may be formed by laminating a single dielectric layer or two or more dielectric layers on upper and lower surfaces of the active region in the Z direction, respectively, and may prevent damages to the first and second internal electrodes 121 and 122 caused by physical or chemical stress.

The first and second internal electrodes 121 and 122 may be applied with different polarities, and may be alternately disposed in the Z direction with the dielectric layer 111 interposed therebetween, and one ends thereof may be exposed to the third and fourth surfaces 3 and 4 of the capacitor body 110, respectively.

In this case, the first and second internal electrodes 121 and 122 may be electrically insulated from each other by a dielectric layer 111 disposed therebetween.

Accordingly, the ends of the first and second internal electrodes 121 and 122, alternately exposed through the third and fourth surfaces 3 and 4 of the capacitor body 110, may be electrically connected to the first and second external electrodes 130 and 140 disposed on the third and fourth surfaces 3 and 4 of the capacitor body 110, respectively.

By the above configuration, when a predetermined voltage is applied to the first and second external electrodes 130 and 140, electric charges may be accumulated between the first and second internal electrodes 121 and 122.

In this case, capacitance of the multilayer capacitor 100 may be proportional to an area of overlap between the first and second internal electrodes 121 and 122, overlapping each other in the Z direction in the active region.

A material for forming the first and second internal electrodes 121 and 122 is not limited to any particular material, and the first and second internal electrodes 121 and 122 may be formed using a noble metal material such as platinum (Pt), palladium (Pd), palladium-silver (Pd—Ag) alloy, and conductive paste including at least one of nickel (Ni) and copper (Cu).

In this case, as the method of printing the conductive paste, a screen printing method or a gravure printing method may be used, and an example embodiment thereof is not limited thereto.

The first and second external electrodes 131 and 141 may be provided with voltages having different polarities, may be disposed at both ends of the capacitor body 110 in the X direction, respectively, and may be electrically connected to exposed portions of the first and second internal electrodes 121 and 122, respectively.

The first external electrode 131 may include a first connection portion 131a and a first band portion 131b.

The first connection portion 131a may be formed on the third surface 3 of the capacitor body 110 and may be connected to the exposed portion of the first internal electrode 121, and the first band portion 131b may extend from the first connection portion 131a to a portion of the first surface 1 of the capacitor body 110.

In this case, the first band portion 131b may further extend to portions of the fifth and sixth surfaces 5 and 6 of the capacitor body 110 and a portion of the second surface 2 to improve adhesion strength.

The second external electrode 141 may include a second connection portion 141a and a second band portion 141b.

The second connection portion 141a may be formed on the fourth surface 4 of the capacitor body 110 and may be connected to the exposed portion of the second internal electrode 122, and the second band portion 141b may extend from the second connection portion 141a to a portion of the first surface 1 of the capacitor body 110.

In this case, the second band portion 141b may further extend to portions of the fifth and sixth surfaces 5 and 6 of the capacitor body 110 and a portion of the second surface 2 to improve adhesion strength.

Also, the first and second external electrodes 131 and 141 may include a metal such as copper (Cu).

The insulator 150 may be disposed on the first surface 1 of the capacitor body 110.

In this case, the insulator 150 may be formed of a material different from that of the capacitor body 110, and may be formed of a material more flexible than the dielectric included in the capacitor body 110.

For example, the insulator 150 may be formed of epoxy, but an example embodiment thereof is not limited thereto.

In one example, a thickness of the insulator 150 may preferably be 16 μm or greater.

The insulator 150 may be disposed to cover the first and second band portions 131b and 132b formed on the first surface 1 side of the capacitor body 110.

The multilayer capacitor in the example embodiment may further include first and second conductive resin layers 132 and 142.

The first conductive resin layer 132 may improve stability of the multilayer capacitor against mechanical stress, and may cover one end of the first external electrode 131 and the insulator 150 in the X direction.

The second conductive resin layer 142 may improve stability of the multilayer capacitor against mechanical stress, and may cover the other end of the second external electrode 132 and the insulator 150 in the X direction.

The first and second conductive resin layers 132 and 142 may include a conductive metal and a resin.

In this case, the conductive metal may be copper or nickel, and the resin may be epoxy.

As another example, the first and second conductive resin layers 132 and 142 may include an intermetallic compound and an epoxy.

The upper surface of the insulator 150 may be in close contact with the first and second band portions 131b and 132b and the first surface 1 of the capacitor body 110, both surfaces of the insulator 150 taken in the X direction may be in contact with the first and second conductive resin layers 132 and 142, respectively, and both ends of the insulator 150 taken in the Z direction may be in contact with the first and second conductive resin layers 132 and 142, respectively.

First and second plating layers 133 and 143 may be formed to cover the first and second conductive resin layers 132 and 142, respectively.

The first and second plating layers 133 and 143 may include first and second nickel (Ni) plating layers covering the first and second conductive resin layers 132 and 142, respectively, and first and second tin (Sn) plating layers covering the first and second nickel plating layers, respectively.

When a length of the active region in the X direction in the capacitor body 110 is defined as 'La', a length of one margin of the capacitor body 110 in the X direction perpendicular to the third and fourth surfaces 3 and 4 is defined as 'Lm', a height of the active region in the first direction is defined as 'Ta', a thickness of the lower cover 113 of the capacitor body 110 is defined as 'Tc', and a thickness of the insulator is defined as 'Te', a relative displacement index, $((La/Lm)-(Ta/Tc))/Te)^2$, may satisfy 0.003 to 0.055. In one example, the length of one margin of the capacitor body 110 may refer to a gap between the active region and the third or fourth surface 3 or 4 in the X direction.

Lm is a factor that suppresses displacement in the X direction, Tc is a factor that suppresses displacement in the Z direction, Te is a factor that absorbs displacement in the Z direction, and the relative displacement index is a formula of correlations among factors.

In the example embodiment, when the relative displacement index satisfies 0.003 to 0.055, an effect of reducing acoustic noise may be optimized. A critical point may be determined to be a point at which acoustic noise decreases by 7 dBA or greater as compared to a reference value of acoustic noise at which no insulator is provided.

Figure 5:
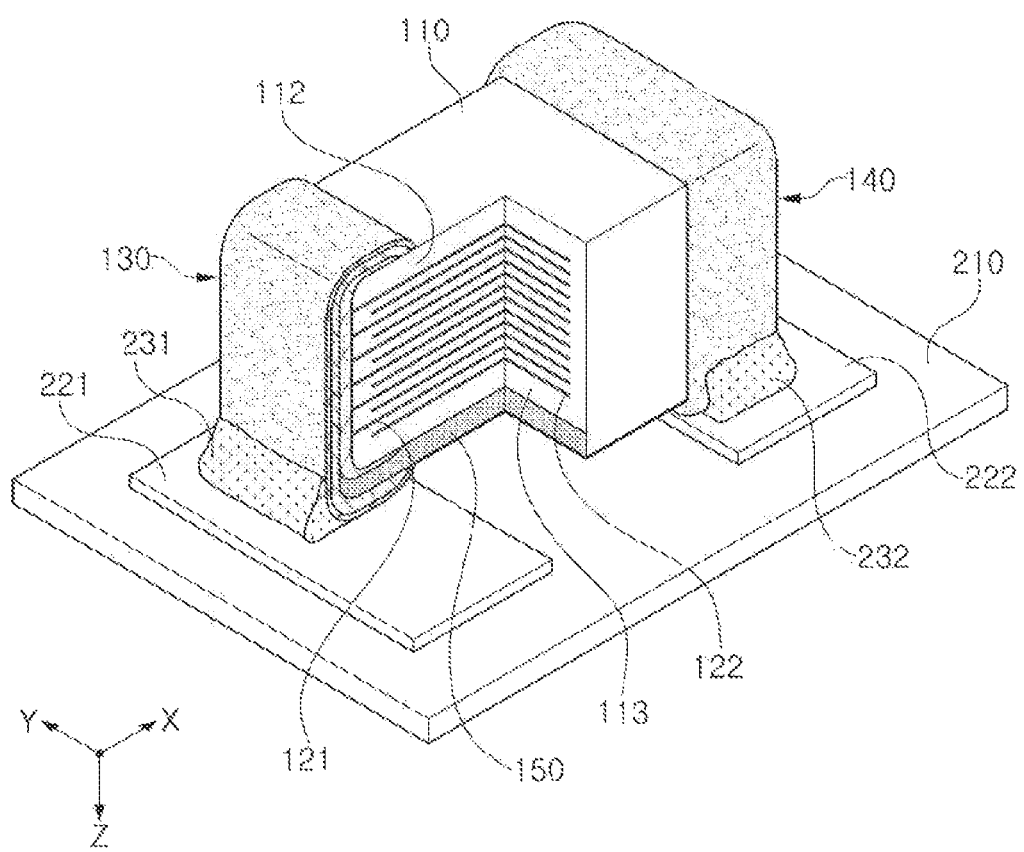
FIG. 5 is a perspective diagram illustrating an example in which a multilayer capacitor is mounted on board.

FIG. 5 is a perspective diagram illustrating an example in which a multilayer capacitor is mounted on board.

Referring to FIG. 5, a board on which the multilayer capacitor is mounted in the example embodiment may include a board 210 on which the multilayer capacitor 100 is mounted, and first and second electrode pads 221 and 222 disposed on an upper surface of the board 210 and spaced apart from each other.

The multilayer capacitor 100 may be electrically connected to the board 210 by solders 231 and 232 in a state in which the first and second plating layers 133 and 134 covering the first and second external electrodes 131 and 132 are disposed on and in contact with the first and second electrode pads 221 and 222.

The multilayer ceramic capacitor 100 in the example embodiment may be a multilayer ceramic capacitor described in the aforementioned example embodiment, and overlapping descriptions will not be provided.

In the example embodiment, acoustic noise may be reduced by disposing an insulator between the external electrode and the conductive resin layer in a lower portion of the multilayer capacitor 100.

In a multilayer capacitor having a small size of 1005 or less, a threshold of a thickness of the insulator to reduce noise may be 100 um or less, and it may be difficult to expect the effect of noise reduction with a PCB or an alumina board due to the limitation in productivity or implementation.

However, in the example embodiment, since the thickness of the insulator 150 may be easily adjusted, an optimum point may be easily reached even in the small-sized multilayer capacitor.

To measure acoustic noise, a sample (a multilayer capacitor) per board for measuring acoustic noise was mounted on a printed circuit board, and the board was mounted on a measurement jig.

A DC voltage and voltage fluctuations were applied to both terminals of the sample mounted on the measurement jig using a DC power supply and a signal generator.

Acoustic noise was measured through a microphone installed directly on the printed circuit board.

In the example embodiment, La, Lm, Ta, Tc, and Te are average values obtained by polishing the surface of the multilayer capacitor perpendicular to the Y direction to a center and measuring lengths of five regions of the imaged cross-sectional surface for each item. Acoustic noise was measured from the experimental results of seven samples for each model.

L is the length of the capacitor body in the X direction, T is the length of the capacitor body in the Z direction, A/N is acoustic noise, and ΔA/N is the amount of change in acoustic noise. Also, the upper cover of the capacitor body may have the same thickness as that of the lower cover.

Figure 4:
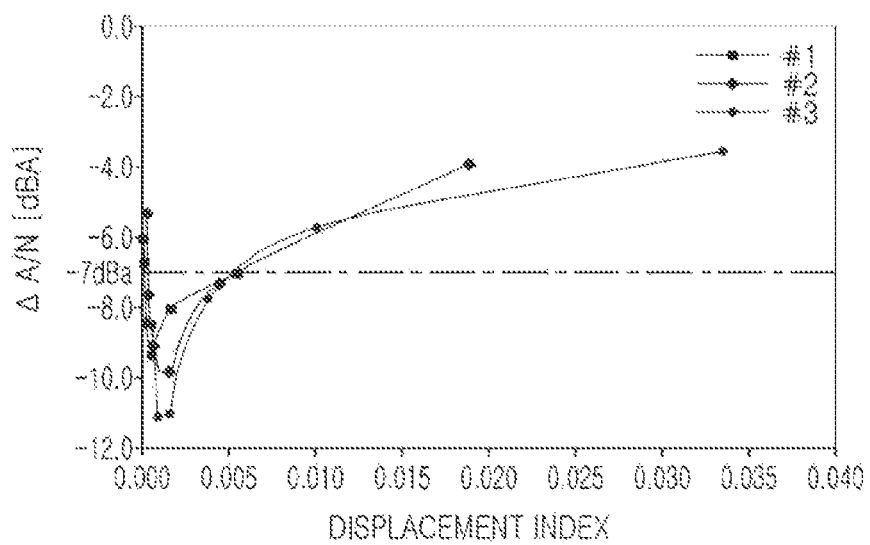
FIG. 4 is a graph illustrating acoustic noise according to changes in a relative displacement index.

FIG. 4 is a graph illustrating acoustic noise according to changes in the relative displacement index.

TABLE 1

|  | 0603 Model | | | | | | |
| --- | --- | --- | --- | --- | --- | --- | --- |
| L | 615 | 615 | 615 | 615 | 615 | 615 | 615 |
| T | 345 | 345 | 345 | 345 | 345 | 345 | 345 |
| La | 551 | 551 | 551 | 551 | 551 | 551 | 551 |
| Lm | 32 | 32 | 32 | 32 | 32 | 32 | 32 |
| La/Lm ------- [1] | 17.2 | 17.2 | 17.2 | 17.2 | 17.2 | 17.2 | 17.2 |
| Ta | 313 | 313 | 313 | 313 | 313 | 313 | 313 |
| Thickness of lower cover (Tc) | 16 | 16 | 16 | 16 | 16 | 16 | 16 |
| Ta/Tc ------ [2] | 19.6 | 19.6 | 19.6 | 19.6 | 19.6 | 19.6 | 19.6 |
| Thickness of insulator (Te) ----- [3] | 0 | 10 | 18 | 31 | 45 | 65 | 79 |
| Relative displacement index $\{([1] - [2])/[3]\}^2$ |  | 0.055 | 0.017 | 0.006 | 0.003 | 0.001 | 0.001 |
| A/N | 34.8 | 27.8 | 26.8 | 25.5 | 26.4 | 28.1 | 28.8 |
| ΔA/N | 0.0 | −7.0 | −8.0 | −9.3 | −8.4 | −6.7 | −6.0 |

Referring to Table 1 and FIG. 4, acoustic noise was reduced by 7 dB or more in the sample having a relative displacement index of 0.003 to 0.055, and an acoustic noise reduction rate was less than 7 dB in the sample having a relative displacement index of 0.001.

of 0.005 to 0.037, and the acoustic noise reduction rate was less than 7 dB in the sample having a relative displacement index of 0.334 and the sample having a relative displacement index of 0.100.

TABLE 2

| | 1005 Model | | | | | | |
|---|---|---|---|---|---|---|---|
| L | 1091 | 1091 | 1091 | 1091 | 1091 | 1091 | 1091 |
| T | 619 | 619 | 619 | 619 | 619 | 619 | 619 |
| La | 1001 | 1001 | 1001 | 1001 | 1001 | 1001 | 1001 |
| Lm | 45 | 45 | 45 | 45 | 45 | 45 | 45 |
| La/Lm | 22.2 | 22.0 | 22.2 | 22.2 | 22.2 | 22.2 | 22.2 |
| [1] | | | | | | | |
| Ta | 579 | 579 | 579 | 579 | 579 | 579 | 579 |
| Thickness of lower cover (Tc) | 20 | 20 | 20 | 20 | 20 | 20 | 20 |
| Ta/Tc | 28.9 | 28.9 | 28.9 | 28.9 | 28.9 | 28.9 | 28.9 |
| [2] | | | | | | | |
| Thickness of insulator (Te) | 0 | 16 | 32 | 54 | 82 | 111 | 140 |
| [3] Relative displacement index $\{([1] - [2])/[3]\}^2$ | | 0.189 | 0.045 | 0.016 | 0.007 | 0.004 | 0.002 |
| A/N | 33.5 | 29.6 | 26.2 | 23.7 | 24.4 | 25.9 | 28.2 |
| ΔA/N | 0.0 | −3.9 | −7.3 | −9.8 | −9.1 | −7.6 | −5.3 |

Referring to Table 2, acoustic noise was reduced by 7 dB or more in the sample having a relative displacement index of 0.004 to 0.045, and the acoustic noise reduction rate was less than 7 dB in the sample having a relative displacement index of 0.189 and the sample having a relative displacement index of 0.002.

Table 4 below lists results of a warpage test according to a structure described in the example embodiment.

The multilayer capacitor used in the sample was manufactured to have the size as in Table 4.

After manufacturing the multilayer capacitors with insulators having varied thicknesses, the multilayer capacitor

TABLE 3

| | 1608 Model | | | | | | |
|---|---|---|---|---|---|---|---|
| L | 1658 | 1658 | 1658 | 1658 | 1658 | 1658 | 1658 |
| T | 795 | 795 | 795 | 795 | 795 | 795 | 795 |
| La | 1562 | 1562 | 1562 | 1562 | 1562 | 1562 | 1562 |
| Lm | 48 | 48 | 48 | 48 | 48 | 48 | 48 |
| La/Lm | 32.5 | 32.5 | 32.5 | 32.5 | 32.5 | 32.5 | 32.5 |
| [1] | | | | | | | |
| Ta | 729 | 729 | 729 | 729 | 729 | 729 | 729 |
| Thickness of lower cover (Tc) | 33 | 33 | 33 | 33 | 33 | 33 | 33 |
| Ta/Tc | 22.1 | 22.1 | 22.1 | 22.1 | 22.1 | 22.1 | 22.1 |
| [2] | | | | | | | |
| Thickness of insulator (Te) | 0 | 18 | 33 | 54 | 83 | 112 | 141 |
| [3] Relative displacement index $\{([1] - [2])/[3]\}^2$ | | 0.334 | 0.100 | 0.037 | 0.016 | 0.009 | 0.005 |
| A/N | 36.5 | 33.0 | 30.8 | 28.8 | 25.5 | 25.4 | 28.0 |
| ΔA/N | 0.0 | −3.5 | −5.7 | −7.7 | −11.0 | −11.1 | −8.5 |

Referring to Table 3, acoustic noise was reduced by 7 dB or more in the sample having the relative displacement index was mounted on a PCB, the board was bent at a rate of 10 mm/sec, and whether cracks were created was observed in a state in which the board was maintained and suppressed for 10 seconds. 10 samples were tested for each sample, and the sample in which even one of the samples had a defect was determined as "Fail."

TABLE 4

| Model | Thickness of insulator | Result of 10 mm warpage strength reliability |
|---|---|---|
| 0603 | 0 | Fail |
|  | 10 | Pass |
|  | 18 | Pass |
|  | 31 | Pass |
|  | 45 | Pass |
|  | 65 | Pass |
|  | 79 | Pass |
| 1005 | 0 | Fail |
|  | 16 | Pass |
|  | 32 | Pass |
|  | 54 | Pass |
|  | 82 | Pass |
|  | 111 | Pass |
|  | 140 | Pass |
| 1608 | 0 | Fail |
|  | 18 | Pass |
|  | 33 | Pass |
|  | 54 | Pass |
|  | 83 | Pass |
|  | 112 | Pass |
|  | 141 | Pass |

Referring to Table 4, when the thickness of the insulator was 16 μm or greater, defects did not occur according to the result of the 100 mm warpage strength reliability test. Therefore, in the example embodiment, a desirable thickness of the insulator may be 16 μm or greater.

As a structure for reducing acoustic noise, a multilayer capacitor in which a lower cover of a capacitor body has a thickness greater than that of an upper cover may be provided.

However, differently from the active region including a metal electrode, the lower cover formed of only a dielectric layer formed of ceramics may be vulnerable to external force such that warpage strength may be deteriorated.

In the example embodiment, an insulator which may be formed of a polymer, different from ceramic and more flexible, may assist the role of the lower cover, and a relative displacement index may be obtained by formulating correlations among factors such as a margin of the capacitor body, a cover, and a thickness of the insulator. The relative displacement index may be limited to be within a predetermined range, such that warpage strength properties may improve by being flexible to external forces, and acoustic noise may improve.

According to the aforementioned example embodiment, acoustic noise of the multilayer capacitor may be reduced and warpage sensitivity may improve.

While the example embodiments have been illustrated and described above, it will be apparent to those skilled in the art that modifications and variations could be made without departing from the scope of the present invention as defined by the appended claims.

What is claimed is:

1. A multilayer capacitor, comprising:
a capacitor body including a dielectric layer and first and second internal electrodes alternately disposed with the dielectric layer interposed therebetween, and including first and second surfaces opposing each other in a first direction, third and fourth surfaces opposing each other in a second direction perpendicular to the first direction, and fifth and sixth surfaces opposing each other in a third direction perpendicular to the first and second directions;
first and second external electrodes disposed to cover the third and fourth surfaces, respectively, and connected to the first and second internal electrodes, respectively; and
an insulator disposed on the first surface of the capacitor body,
wherein the capacitor body includes an active region in which first and second internal electrodes overlap each other in the first direction, and upper and lower covers disposed above and below the active region in the first direction, and
wherein, where a length of the active region in the second direction is defined as 'La', a length of one margin of the capacitor body in the second direction is defined as 'Lm', a height of the active region in the first direction is defined as 'Ta', a thickness of the lower cover of the capacitor body is defined as 'Tc', and a thickness of the insulator is defined as 'Te', a relative displacement index, $((La/Lm)-(Ta/Tc))/Te)^2$, ranges from 0.003 to 0.055.

2. The multilayer capacitor of claim 1, further comprising:
a first conductive resin layer covering the first external electrode and a first end of the insulator; and
a second conductive resin layer covering the second external electrode and a second end of the insulator.

3. The multilayer capacitor of claim 2, wherein the first and second conductive resin layers include a conductive metal and a resin.

4. The multilayer capacitor of claim 2,
wherein the first and second external electrodes include copper (Cu), and
wherein the first and second conductive resin layers include a conductive metal and a resin.

5. The multilayer capacitor of claim 2, further comprising first and second plating layers covering the first and second conductive resin layers, respectively.

6. The multilayer capacitor of claim 5, wherein the first and second plating layers include first and second nickel (Ni) plating layers covering the first and second conductive resin layers, respectively, and first and second tin (Sn) plating layers covering the first and second nickel (Ni) plating layers, respectively.

7. A board including the multilayer capacitor of claim 5 mounted thereon, the board comprising:
first and second electrode pads on one surface of the board,
wherein the multilayer capacitor is mounted such that first and second plating layers of the multilayer capacitor are connected to first and second electrode pads, respectively.

8. The multilayer capacitor of claim 1,
wherein the first external electrode includes a first connection portion disposed on the third surface of the capacitor body; and a first band portion extending from the first connection portion onto a portion of the first surface of the capacitor body, and
wherein the second external electrode includes a second connection portion disposed on the fourth surface of the capacitor body; and a second band portion extending from the second connection portion onto a portion of the first surface of the capacitor body.

9. The multilayer capacitor of claim 8, wherein the insulator is disposed to cover the first and second band portions.

10. The multilayer capacitor of claim 1, wherein a thickness of the insulator is 16 μm or greater.

11. The multilayer capacitor of claim 1, wherein the first and second external electrodes include copper (Cu).

12. The multilayer capacitor of claim 1, wherein the insulator includes a material different from a material of the capacitor body.

13. The multilayer capacitor of claim 12, wherein the material of the insulator is more flexible than the material of the capacitor body.

14. The multilayer capacitor of claim 1, wherein the insulator includes epoxy.

15. A multilayer capacitor, comprising:
a capacitor body including a dielectric layer and first and second internal electrodes alternately disposed with the dielectric layer interposed therebetween, and including first and second surfaces opposing each other in a first direction, third and fourth surfaces opposing each other in a second direction perpendicular to the first direction, and fifth and sixth surfaces opposing each other in a third direction perpendicular to the first and second directions;
first and second external electrodes disposed to cover the third and fourth surfaces, respectively, and connected to the first and second internal electrodes, respectively;
first and second conductive resin layers covering the first and second external electrodes, respectively; and
an insulator disposed on the first surface of the capacitor body,
wherein each of the first and second external electrodes includes a connection portion disposed on the third or fourth surface of the capacitor body; and a band portion extending from the connection portion onto a portion of the first surface of the capacitor body,
wherein a portion of the insulator is disposed between the band portion and the first or second conductive resin layer in the first direction,
wherein the capacitor body includes an active region in which the first and second internal electrodes overlap each other in the first direction, and upper and lower covers disposed above and below the active region in the first direction, and
wherein, where a length of the active region in the second direction is defined as 'La', a length of one margin of the capacitor body in the second direction is defined as 'Lm', a height of the active region in the first direction is defined as 'Ta', a thickness of the lower cover of the capacitor body is defined as 'Tc', and a thickness of the insulator is defined as 'Te', a relative displacement index, $((La/Lm)-(Ta/Tc))/Te)^2$, ranges from 0.003 to 0.055.

16. The multilayer capacitor of claim 15, wherein an outer surface of the band portion is located at a level lower than the first surface of the capacitor body.

17. The multilayer capacitor of claim 15, wherein the second surface of the capacitor body is free of an insulator.

18. The multilayer capacitor of claim 15, wherein the insulator covers an entire portion of the first surface of the capacitor body.

19. The multilayer capacitor of claim 15, wherein the insulator includes a material different from a material of the capacitor body.

* * * * *